United States Patent
Wu et al.

(10) Patent No.: US 7,068,120 B2
(45) Date of Patent: Jun. 27, 2006

(54) ELECTROMAGNETIC BUS COUPLING HAVING AN ELECTROMAGNETIC COUPLING INTERPOSER

(75) Inventors: Yinan Wu, Westborough, MA (US); Tao Liang, Westford, MA (US); John R. Benham, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/183,614

(22) Filed: Jun. 25, 2002

(65) Prior Publication Data

US 2003/0236005 A1    Dec. 25, 2003

(51) Int. Cl.
*H01P 5/02* (2006.01)
*H01P 5/18* (2006.01)

(52) U.S. Cl. .................. 333/24 R; 333/109; 710/100; 710/305

(58) Field of Classification Search ............. 333/24 R, 333/109; 710/100, 305
See application file for complete search history.

(56) References Cited

U.S. PATENT DOCUMENTS

| | | | |
|---|---|---|---|
| 3,516,065 A | 6/1970 | Bolt et al. | |
| 3,619,504 A | 11/1971 | De Veer Olney et al. | |
| 3,673,548 A | 6/1972 | Mattingly et al. | |
| 5,192,832 A | 3/1993 | Rudy, Jr. et al. | |
| 5,363,071 A | 11/1994 | Schwent et al. | |
| 5,432,486 A * | 7/1995 | Wong .......................... | 333/109 |
| 5,638,402 A | 6/1997 | Osaka et al. | |
| 5,958,030 A | 9/1999 | Kwa | |
| 6,111,476 A | 8/2000 | Williamson | |
| 6,163,464 A | 12/2000 | Ishibashi et al. | |
| 6,335,662 B1 | 1/2002 | Del Rosario, Jr. et al. | |
| 6,399,898 B1 | 6/2002 | Kwong et al. | |
| 6,434,647 B1 * | 8/2002 | Bittner, Jr. .................. | 710/100 |
| 6,438,012 B1 * | 8/2002 | Osaka et al. .................. | 365/52 |
| 6,498,305 B1 * | 12/2002 | Marketkar et al. .......... | 174/250 |
| 6,573,801 B1 | 6/2003 | Benham et al. | |
| 6,576,847 B1 | 6/2003 | Marketkar et al. | |
| 6,625,682 B1 | 9/2003 | Simon et al. | |
| 6,705,898 B1 | 3/2004 | Pechstein et al. | |
| 6,882,239 B1 * | 4/2005 | Miller ....................... | 333/24 R |
| 2001/0024888 A1 | 9/2001 | Marketkar et al. | |
| 2001/0053187 A1 | 12/2001 | Simon et al. | |
| 2002/0018526 A1 | 2/2002 | Osaka et al. | |
| 2003/0150642 A1 | 8/2003 | Wu et al. | |
| 2003/0152153 A1 | 8/2003 | Simon et al. | |
| 2003/0227346 A1 | 12/2003 | Simon et al. | |
| 2003/0227347 A1 | 12/2003 | Simon et al. | |

FOREIGN PATENT DOCUMENTS

WO    WO 00/72163    11/2000

* cited by examiner

*Primary Examiner*—Benny Lee
(74) *Attorney, Agent, or Firm*—Philip A. Pedigo

(57) ABSTRACT

An assembly (for example, an assembly in the form of an interposer that is distinct from a motherboard and from the devices that communicate with the motherboard) includes electromagnetic couplings. Each of the electromagnetic couplings couples signals being communicated between a device and a bus. Each of the electromagnetic couplings is connected to (a) an associated bus connector to provide connections of the couplings to the bus, and (b) an associated device connector to provide connections of the couplings to the device.

29 Claims, 3 Drawing Sheets

ELECTROMAGNETIC BUS COUPLING HAVING AN ELECTROMAGNETIC COUPLING INTERPOSER

BACKGROUND

This description relates to electromagnetic bus coupling.

Electromagnetic couplings can be used, for example, to couple data between electronic devices and a communication bus (e.g., a multi-drop bus) in place of direct electrical connections. Such an arrangement is proposed in U.S. Pat. No. 5,638,402.

DETAILED DESCRIPTION OF THE INVENTION

Figure 1:
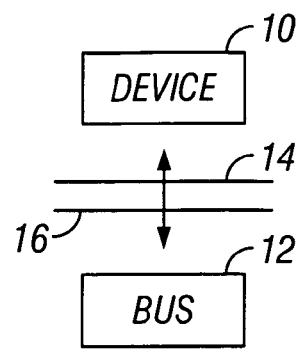
FIG. 1 shows an electromagnetic coupling.

As shown in FIG. 1, in electromagnetic bus coupling, signals are communicated between a device 10 and a bus 12 by electromagnetic coupling between two conductors 14, 16 that are close together.

One way to hold the conductors close together, described here, is by mounting them, for example, on a single structural medium ("buried coupling"), for example, in the form of two nearby traces on a mother board. Conversely, the two conductors may be mounted in two separate structural media that are then connected to hold the conductors close together on two "sides" of a coupling interface ("interface coupling").

In one proposed method of interface coupling, the conductor that is on the device side is formed on a flexible substrate, and the conductor that is on the bus side is formed on an exposed surface of a motherboard. The flexible substrate is pressed against the surface of the motherboard and held in place to establish the electromagnetic coupling. In another interface coupling approach, both conductors are held in a socket into which a daughterboard bearing the device is inserted. The socket is soldered to the motherboard bus traces.

Buses generally have many lines, and the electromagnetic coupling is provided for each of the lines of the bus, for example, using many conductors on the flexible substrate or in the socket.

Buried coupling can be achieved, for example, inside a motherboard that carries the bus or on a daughter card. Buried coupling on the motherboard may be done, for example, laterally between traces formed on a single plane of the motherboard or vertically between traces formed on different layers of the motherboard.

In a typical multi-drop bus, the bus extends across a motherboard, and two or more sockets are arranged at respective drop locations along the bus. At each location, a socket may be mounted on the motherboard and connected to lines of the bus and to power and ground carried in the motherboard. A daughter card may be inserted into the socket so that a device included on the daughter card may communicate with the bus.

Figure 2:
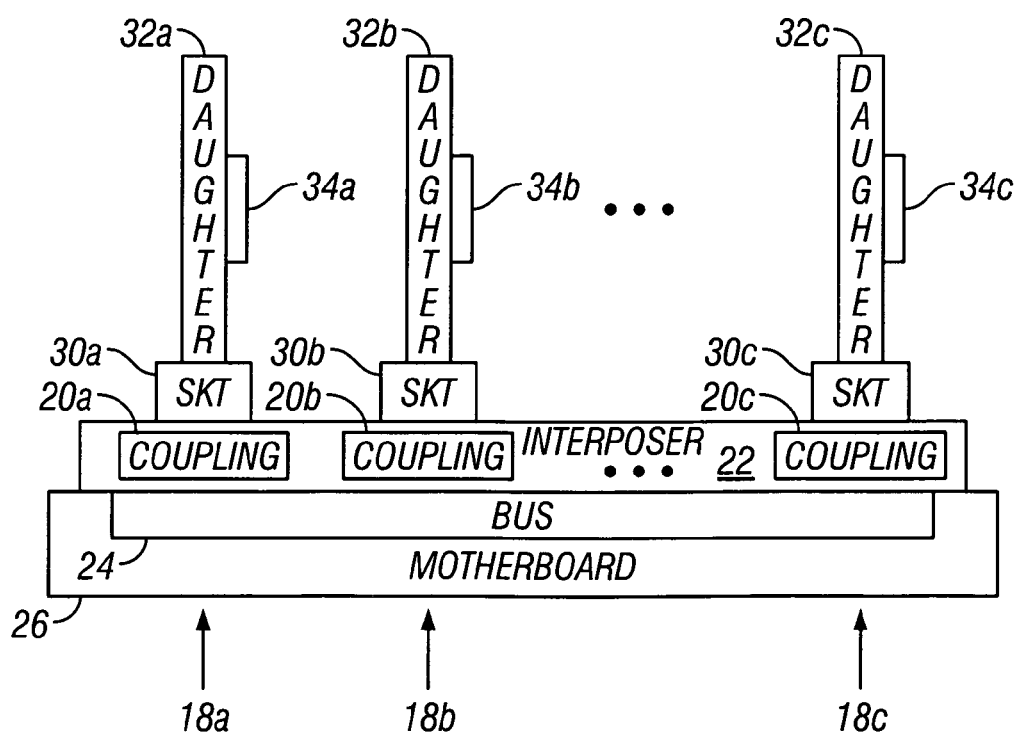
FIG. 2 is a schematic side view of a multi-drop bus coupling system.

Another technique for achieving electromagnetic coupling is illustrated by the example shown schematically in FIG. 2, in which the couplings are buried in a unified discrete structure that may be called an interposer. At each drop position 18a, 18b, . . . 18c, an electromagnetic coupling 20a, 20b, . . . 20c, is buried on an interposer 22, which, in some examples may be implemented on a multi-layer circuit board. The interposer 22 is connected to a bus 24, which is formed on a motherboard 26. A socket 30a, 30b, . . . 30c is electrically connected to the coupling for communication and is attached mechanically to the motherboard 26 for support. A daughter card 32a, 32b, . . . 32c, is inserted into the socket. The daughter card includes a device 34a, 34b, . . . 34c, that communicates through the bus.

Forming the couplings in an interposer, compared to forming them on a motherboard, for example, has advantages. By burying the electromagnetic couplings in an interposer, design and manufacturing choices about the motherboard, the sockets or the daughter cards need not be altered or compromised. The costs of the motherboard, sockets, and daughter cards may therefore be kept down. Tighter manufacturing tolerances and extremely good coupling performance can be achieved using the interposer approach. The interposer may make use of dielectric materials and conductor thicknesses and widths that may be smaller than those typically used on motherboards, which typically use thicker dielectrics and conductor dimensions to assure mechanical robustness. In the interposer, the couplers may be formed of high performance dielectric layers that have desirably high dielectric constants or materials whose electromagnetic properties may be varied by applying local static electric or magnetic bias fields, thus permitting the coupling coefficient of the individual couplers to be varied in order to optimize the available transmission bandwidth. Such materials typically would not be integrated into a motherboard structure for economic and manufacturing reasons. Well-developed substrate manufacturing technology can be used to achieve highly uniform coupling performance from unit to unit. Incorporating the transceiver on the interposer reduces the need for space on the daughter card.

A wide variety of implementations are possible. One example is shown in FIG. 3.

Figure 3:
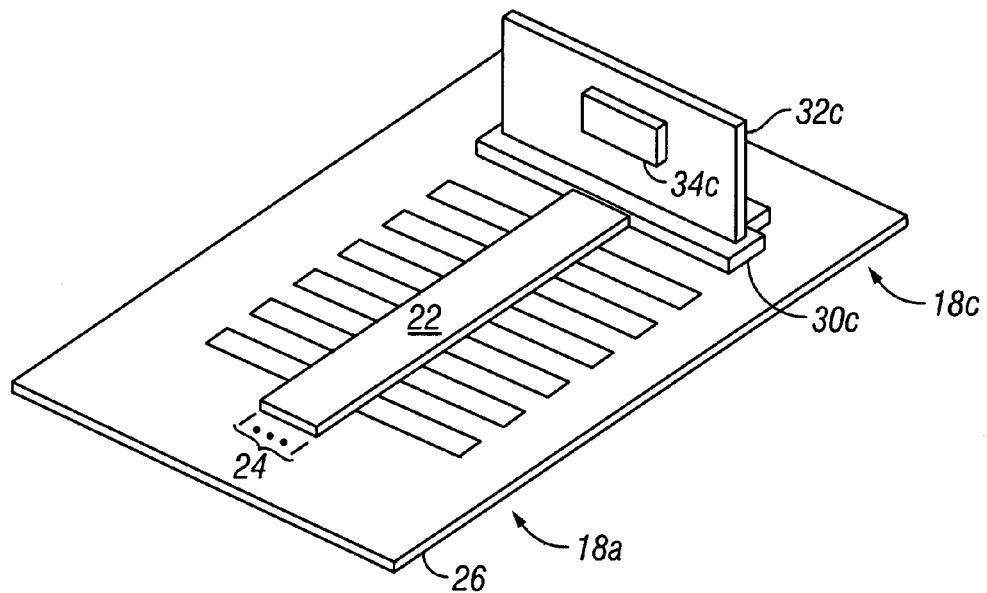
FIG. 3 is a schematic three-dimensional view of a multi-drop bus coupling system.

In FIG. 3, the interposer 22 is formed as a multi-layer circuit board that is mounted along the length of the bus 24. Each socket 30a. . . 30c, is mounted on the mother board 26 at one of the drop positions 18a. . . 18c. (Only one socket 30c is shown in FIG. 3; seven other drop positions are shown schematically.) A daughter card 32c is inserted into the socket 30c at the drop position 18c . The daughter card 32c includes a device 34c that communicates through the bus.

Figure 4:
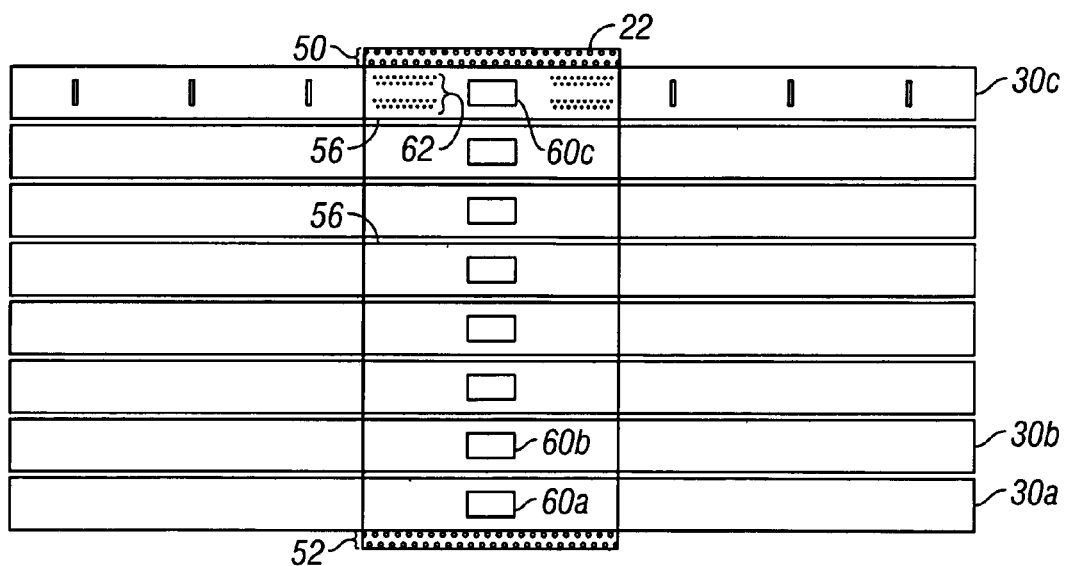
FIG. 4 is a top view of sockets and an interposer.

As shown in FIG. 4 (a top view of eight sockets including the sockets 30a. . . 30c and an interposer 22 ), the interposer 22 may be surface-mounted on the motherboard using two ball grid arrays (BGA) of solder balls 50, 52 at opposite ends of the interposer. The upper surface of the motherboard and the bottom surface of the interposer 22 have patterns of contact pads corresponding to the BGA. The motherboard contact pads for one of the BGAs 50 are connected to signal and power and ground conductors in the motherboard. The motherboard contact pads for the other of the BGAs 52 are isolated and provide mechanical support for the interposer 22. Although not shown in FIG. 4, additional rows of solder balls may be used to attach the interposer to the motherboard (for mechanical support) in the spaces 56 between adjacent sockets.

At each drop location, a signal processing circuit 60*a*, 60*b*... 60*c* is mounted on the top of the interposer circuit board. Also on top of the interposer at each drop location are holes of a micro pin grid array 62, which are arranged to receive pins of a socket.

Signal processing circuit 60*a* of FIG. 4 may, for example, be a transceiver integrated circuit (TiC) that is configured to provide a bidirectional link by modulating signals passing from the daughter card to the bus and by demodulating signals passing from the bus to the daughter card.

The connection of the interposer to the motherboard bus at only one end helps to reduce parasitic effects arising from the interconnection. The extended bus traces in the interposer are electrically terminated at the end opposite to the end at which the traces are connected to the motherboard bus. The use of BGA mounting also reduces the effect of the connection on signal integrity. The BGA pad configurations may also be designed to control impedance effects at the connections.

Figure 5:
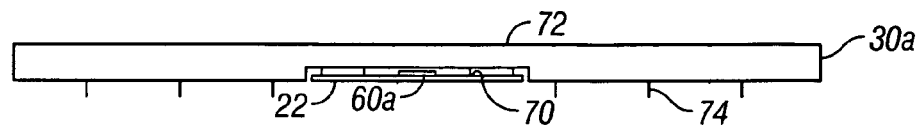
FIG. 5 is a cross-sectional view of a socket and an interposer.

As shown in FIG. 5, each socket 30*a* may include an array of pins 70 that match the micro pin grid array of the interposer 22 and a well 72 that houses the interposer 22 when the socket is mounted. The socket 30*a* also includes a set of mechanical mounting clips 74. The socket 30*a* has a slot (not shown) to receive a daughter card. Contact conductors arranged in the slot make contact with, for example, edge pads arranged on a surface of the daughter card. The interposer 22 includes a signal processing circut 60*a* and traces that run the length of the interposer 22 and carry the bus signals and voltage and ground, in effect forming an extension of the bus.

Figure 6:
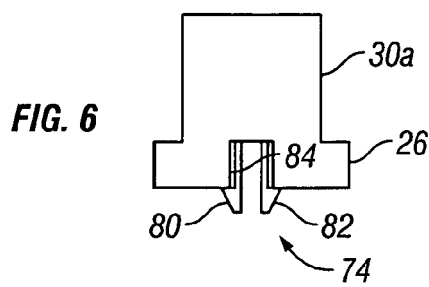
FIG. 6 is a cross-sectional view of a socket and a motherboard.

As shown in FIG. 6, each of the clips 74 of the socket 30*a* includes two resilient legs 80, 82, having tapered ends. The legs lock into place when the clip is forced into a corresponding hole in the motherboard 26. Clearance 84 is provided so that the lateral position of the interposer relative to the motherboard 26 may vary without placing lateral stress on the solder balls of the ball grid arrays or on the pins of the pin grid, which have tight tolerance requirements to assure electrical connection.

Figure 7:
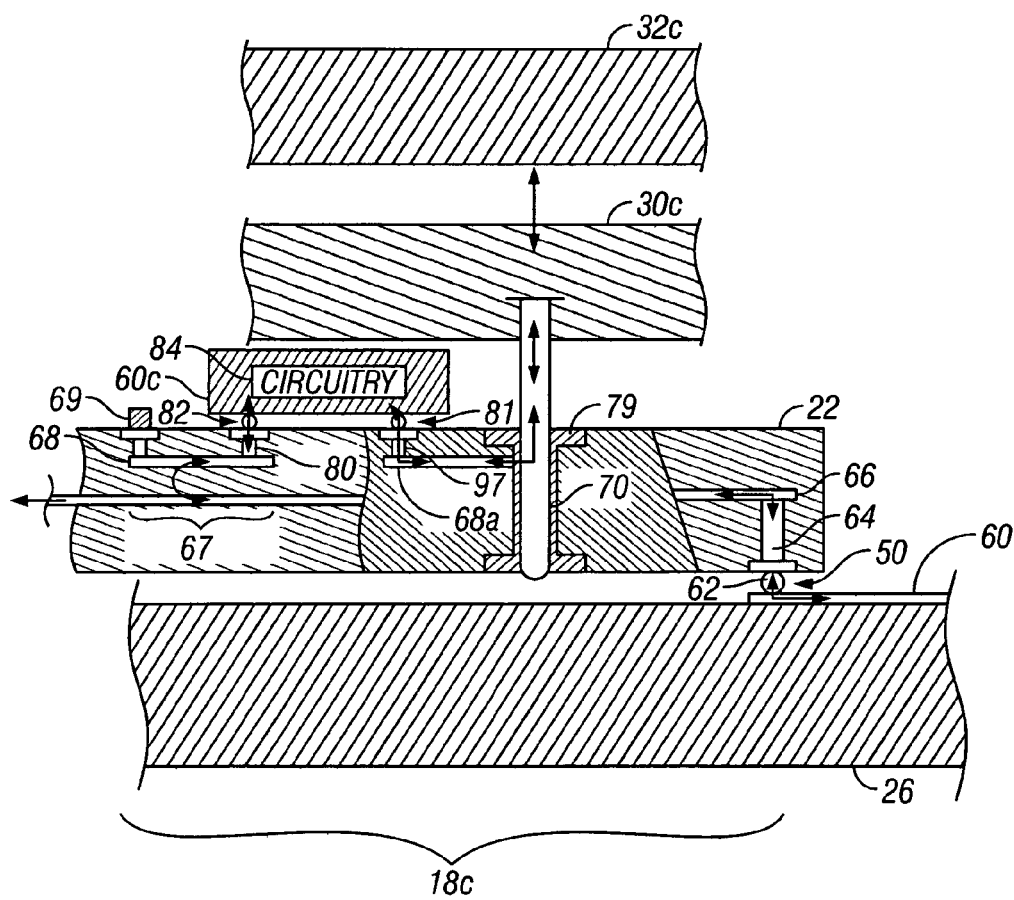
FIG. 7 is a cross-sectional view of part of a bus coupling system.

As shown in FIG. 7 (an enlarged side sectional view), signals travel along the path indicated by the double-ended arrows between the bus and the socket at a given drop position 18*c*. The signals pass between a bus trace 60 on the surface of the motherboard 26 and a corresponding extended bus trace 66 embedded in the interposer 22 through the medium of a ball 62 of the ball grid array 50 and a conductive via 64 formed in the interposer 22. The signals pass along extended bus trace 66, which extends along the length of the interposer to all of the drop positions. A region 67 of the extended bus trace 66 at drop position 18*c* serves as a conductor for electromagnetic coupling with a second conductive trace 68 embedded on a different layer of the interposer. (Trace 68 is coupled at one end to a via 80 and is terminated at the other end by a resistor 69 (through another via.))

The electromagnetically coupled signal then passes along conductive via 80 and solder ball 82 into circuit 60*c*. After processing by circuitry 84, the signal passes through solder ball 81 and a via 97 to a trace 68*a* and then to a plated through hole 79, and then into pin 70 that carries the signal to the socket 30*c*. From there the signal passes to the daughter card 32*c*. (Note that, in the figure, the pin 70 does not electrically touch the trace 66 nor does it touch the circuit 84 but rather is behind each of them.)

During assembly, the TiC dice may be directly attached to the interposer using a Controlled Collapse Chip Connection (C4) flip chip process, or the TiC may be packed in flip chip ball grid array (FCBGA) packages and then reflowed to the interposer.

The populated interposer is then attached to the motherboard using the BGAs. Then each socket is attached electrically by inserting its pins into the interposer micro pin grid array (PGA) plated-through holes and mechanically by inserting its support clips into the through-holes in the motherboard.

The system described above, and other examples, have one or more of the following advantages and may also have other advantages. Because the electromagnetic coupling and interconnection functions are performed on the interposer, the layout and stackup design of the interposer is not constrained by other requirements (for example requirements that may apply if those functions are embedded on a motherboard, as discussed earlier). The lack of constraints enables substantial flexibility for interposer design and manufacture, permitting achievement of optimal coupling performance with controlled variation. The electromagnetic coupling on the interposer can easily be made either between traces on a common plane, or between traces on different planes. The dielectric layer can be made thin to permit the coupling region to be miniaturized for a given coupling strength requirement. High precision manufacturing processes may be applied to the interposer to achieve tight tolerances. Coupling characteristics can be achieved with high electrical performance repeatability and high mechanical reliability and stability across large numbers of manufactured units in high-volume, cost-constrained applications. The amount of space and the pitch required for each daughter card on the motherboard may be small. Incorporating the signal processor on the interposer reduces the requirement for placing special circuitry on the daughter card, space that is often not available. The TiC chip is integrated to the interposer, creating a cost effective component without requiring daughter card modification. Physical limitations of the daughter card layout can be disregarded. The effect on signal integrity from transferring the main signal path off the motherboard is reduced by utilizing only one surface mount interconnect for multiple drops.

Although some examples have been described above, other implementations are also within the scope of the following claims.

For example, although the interposer was described as having the extended bus traces running within the board of the interposer, the extended bus traces could be provided on a surface of the interposer or implemented in other ways. Similarly, although the TiC circuitry is shown being mounted on a surface of the interposer, that circuitry could be implemented in other ways, for example mounted on the daughter card. Other techniques of mounting the interposer on the motherboard and of connecting the bus to the interposer extended bus traces could be used in addition to the BGAs described earlier. The sockets need not be mounted by a PGA but could be attached to permanently on the interposer board by surface mount or other techniques.

What is claimed is:

1. Apparatus comprising
an integrated assembly including
electromagnetic couplings, each of the electromagnetic couplings to electromagnetically couple signals being communicated between a respective device and a continuous conductive bus,
each of the electromagnetic couplings comprising conductors between which the electromagnetic coupling occurs, the conductors being distinct from the bus;
one of the conductors of each of the electromagnetic couplings being connected to an associated bus connector to provide a connection of the one conductor to the bus, and a second one of the conductors of each of the electromagnetic couplings being connected to an associated device connector to provide a connection of the second conductor to the device.

2. The apparatus of claim 1 in which the integrated assembly comprises an interposer, the device comprises a daughter board, and the bus is part of a motherboard.

3. The apparatus of claim 1 in which the conductors of each of the couplings are disposed in fixed positions within the assembly.

4. The apparatus of claim 1 in which the assembly also includes driver circuitry for processing the signals on the device side of the electromagnetic couplings.

5. The apparatus of claim 4 in which the driver circuitry is embodied in a flip chip.

6. The apparatus of claim 1 in which the associated device connector is to provide electrical connections to a socket.

7. The apparatus of claim 1 in which the bus connector is to provide electrical connections to the bus.

8. The apparatus of claim 7 in which the assembly is connected to the bus by only one junction and the bus connectors of the assembly are connected to the one junction.

9. Apparatus comprising
a socket assembly including
terminals to make electrical connection with terminals of a circuit board that is to be mounted on the socket assembly,
terminals to make electrical connection with a second assembly that is to be mounted on a motherboard, the motherboard including a continuous conductive bus, the second assembly including electromagnetic coupling comprising conductors that are distinct from the bus, and
mechanical supports on the socket assembly, the mechanical supports to be attached to the motherboard.

10. The apparatus of claim 9 in which the socket assembly is elongated, the mechanical supports are located nearer to opposite ends of the socket assembly and the terminals of the socket assembly are located nearer the middle of the socket assembly.

11. The apparatus of claim 9 in which the mechanical supports comprise resilient lockable pins.

12. A system comprising
a continuous conductive bus,
an assembly connected to the bus, the assembly including electromagnetic couplings adapted for communicating signals between the bus and devices served by the assembly, each of the electromagnetic couplings comprising at least two conductors between which electromagnetic coupling occurs, the at least two conductors being distinct from the bus, and
sockets connected to the assembly and to receive circuit boards which contain the devices.

13. The system of claim 12 also including a motherboard on which the bus is disposed.

14. The system of claim 13 also including daughter cards mounted in the sockets.

15. The system of claim 12 in which the at least two conductors of the assembly are disposed in fixed positions.

16. The system of claim 12 in which the assembly also includes driver circuitry for processing the signals on the device side of the electromagnetic couplings.

17. The system of claim 16 in which the driver circuitry is embodied in a flip chip.

18. The system of claim 12 in which the assembly is connected to the bus by only one junction and the electromagnetic couplings are connected to the one junction.

19. Apparatus comprising
an assembly including
multiple means for electromagnetic coupling, each of the multiple means being for electromagnetically coupling signals being communicated between a device and a continuous conductive bus, each of the multiple means for electromagnetic coupling comprising conductors between which the electromagnetic coupling occurs, the conductors being distinct from the bus, and
one of the conductors of each of the multiple means being connected to an associated bus connector to carry the signals between the one conductor and the bus, and a second one of the conductors of each of the multiple means being connected to an associated device connector to carry the signals between the second conductor and the device.

20. The apparatus of claim 19 in which the assembly also includes means for processing the signals on the device side of the electromagnetic couplings.

21. A method comprising
receiving, on an assembly, signals from a continuous conductive bus, the assembly being separate from a motherboard on which the bus is disposed, the assembly comprising conductors between which electromagnetic coupling occurs, the conductors being distinct from the continuous conductive bus;
electromagnetically coupling at least some of the signals between at least two conductors of the assembly, the at least two conductors being distinct from the continuous conductive bus, and
sending the signals towards a device, the device being seperate from the assembly.

22. The method of claim 21 also including processing the signals in the assembly after the signals have been electromagnetically coupled.

23. The method of claim 21 also including
electromagnetically coupling others of the signals in the assembly, and
sending the other signals towards at least one other device.

24. Apparatus comprising
a continuous conductive bus,
an interposer connected at one junction on the bus, and
electromagnetic couplings at separate locations in the interposer, each of the electromagnetic couplings comprising conductors between which electromagnetic coupling occurs, the conductors being distinct from the bus and carrying signals towards respective devices, the devices being seperate from the interposer.

25. The apparatus of claim 24 also including circuitry to process the signals from the couplings and to deliver the signals to the conductors.

26. A method comprising
attaching an assembly to a continuous conductive bus of a motherboard, the assembly including electromagnetic couplings, each of the electromagnetic couplings comprising conductors between which electromagnetic coupling occurs, the conductors being distinct from the bus, and
connecting sockets to the assembly, the sockets to receive a circuit board.

27. The method of claim 26 in which the attaching includes soldering a ball grid array.

28. The method of claim 26 in which the connecting includes attaching the socket at a micro pin grid array.

29. The method of claim 26 in which the connecting includes attaching the socket to the motherboard.

* * * * *

UNITED STATES PATENT AND TRADEMARK OFFICE
CERTIFICATE OF CORRECTION

PATENT NO. : 7,068,120 B2
APPLICATION NO. : 10/183614
DATED : June 27, 2006
INVENTOR(S) : Wu et al.

It is certified that error appears in the above-identified patent and that said Letters Patent is hereby corrected as shown below:

Column 3, at line 29, after the first occurrence of "socket" insert --30a--.

Column 3, at line 29, delete "30aalso" and insert --30a also--.

Column 3, at line 30, delete "30ahas" and insert --30a has--.

Column 3, at line 38, delete "30aincludes" and insert --30a includes--.

Signed and Sealed this

Fourth Day of December, 2007

JON W. DUDAS
*Director of the United States Patent and Trademark Office*